United States Patent [19]

Hurley

[11] Patent Number: 4,532,471
[45] Date of Patent: Jul. 30, 1985

[54] POWER THEFT DETECTION CIRCUIT

[75] Inventor: James R. Hurley, Brookfield, Wis.

[73] Assignee: McGraw-Edison Company, Rolling Meadows, Ill.

[21] Appl. No.: 373,984

[22] Filed: May 3, 1982

[51] Int. Cl.³ .................. G01R 11/24; G01R 1/20
[52] U.S. Cl. ............................... 324/110; 324/127
[58] Field of Search ............... 324/110, 127, 157, 133; 340/637

[56] References Cited

U.S. PATENT DOCUMENTS

| | | | |
|---|---|---|---|
| 4,301,403 | 11/1981 | Hawkes et al. | 324/62 |
| 4,331,915 | 5/1982 | Fielden | 324/110 |
| 4,337,466 | 6/1982 | Spahn | 340/870.09 |

Primary Examiner—Ernest F. Karlsen
Attorney, Agent, or Firm—Jon Carl Gealow; James A. Gabala; Thomas Vigil

[57] ABSTRACT

The power theft detector circuit (10, 110 and 210) detects when current is being diverted around a line conductor (20 or 220) passing through a meter housing (14 or 214). The circuit (10, 110 or 210) includes a current transformer (12, 112 or 212) coupled to the line conductor (20 or 220) within the meter and defines a primary winding (20 or 220) of the current transformer (12, 112 or 212). A secondary circuit (23, 123 or 224) includes a secondary winding (22, 122 or 226) of the transformer (12, 112 or 212) and sensing circuitry (24, $R_m$, $R_1$, and S; 124, $R_m$, $R_1$, S and 126; 232, $R_m$, and 240) for sensing a change in the impedance reflected from the primary circuit into the secondary circuit (23, 123 or 224) when a low impedance jumper (26, 260) is connected in parallel with the line conductor (20 or 220) in the meter thereby to sense a power theft condition.

3 Claims, 4 Drawing Figures

POWER THEFT DETECTION CIRCUIT

TECHNICAL FIELD

The present invention relates to a method and apparatus for detecting the theft of power when a short circuit jumper is coupled across a line conductor passing through a watthour meter. More specifically, the present invention relates to a power theft detection circuit which operates on the principal of differences in reflected impedances across a current transformer and different branching of currents before and after a low resistance jumper is connected across a line conductor passing through a meter.

BACKGROUND ART

In recent years, energy, particularly its cost, has become a predominant concern of our society. The U.S. government has even established a Department of Energy for the purpose of assisting individuals and corporations in the investigation of more efficient and less expensive forms of energy, means for producing energy and utilization of energy.

In the private sector, electric utility companies have been investigating ways to cut down on distribution losses of electric energy and thereby improve the efficiency of their existing electric distribution systems. One significant area of electricity losses is the increasing theft of electric power by certain consumers which increases the cost of electricity to all consumers.

Accordingly, for some time, electric utilities have been looking for ways to detect and stop the theft of power so that the cost of electric power to all consumers can be reduced.

Typically, the theft of power is effected by a consumer inserting a low resistance jumper cable around the meter so that the current coming into the meter is divided partially through the line conductor passing through the meter and partially through the jumper around the meter. The lower the resistance of the jumper, the greater the diversion of current around the meter and the greater the theft of power.

The method and apparatus of the present invention are useful in detecting this type of power theft where a jumper splits the current around the meter so that only part of the current used by the consumer flows through the meter and the other part flows through the jumper.

As will be explained in greater detail hereinafter, if there is no current passing through the line conductor, the power theft detection circuit of the present invention cannot be utilized to measure a power theft. However, when there is a split of current, part flowing through the line conductor through the meter, and part through the jumper, the power theft detection circuit of the present invention can sense the theft and raise an alarm.

Heretofore, such power theft obtained by splitting the current at the meter and bypassing some of the current used by the consumer through a jumper around the meter was only detected by visual observation or inspection of the consumer's electrical service and meter system or by noting a decrease in the use of electricity by the consumer.

As will be described in greater detail hereinafter, the power theft detection circuit of the present invention and method for using same enable an electric utility to determine whenever a power theft condition exists by reason of a low resistance jumper around the meter.

Additionally, the power theft detection circuit of the present invention can be coupled to a microprocessor such as is found in an electronic or solid state watthour meter of the type disclosed in copending applications Ser. No. 303,599 filed on Sept. 18, 1981 for: SOLID STATE WATTHOUR METER (now U.S. Pat. No. 4,466,074) and Ser. No. 353,476 filed on Mar. 1, 1982 for: ELECTRO-OPTICAL SENSOR FOR WATTHOUR METER (now U.S. Pat. No. 4,489,384), the disclosures of which are incorporated herein by reference.

DISCLOSURE OF INVENTION

According to the invention there is provided a method for detecting the theft of electric power by a low resistance jumper connected in parallel with a line conductor passing through a meter including the steps of: coupling the line conductor within the meter to a current transformer such that the line conductor forms a primary winding for the current transformer; providing a multiturn secondary winding on the current transformer for forming part of a secondary circuit; and electrically sensing a change of the impedance reflected into the secondary circuit from the primary circuit when a low impedance jumper is connected in parallel with the impedance of the line conductor forming the primary winding.

Further according to the invention there are provided power theft detection means for detecting when power is being diverted around a line conductor passing through a meter housing comprising: transformer circuit means coupled to at least one line conductor within a meter housing, said line conductor in said meter housing defining a primary winding of of said transformer circuit means and forming at least part of a primary circuit, said transformer circuit means including a secondary winding, secondary circuit means including said secondary winding, and means in said secondary circuit for sensing a change in the impedance reflected from the primary circuit into the secondary circuit when a low impedance jumper is connected in parallel with the line conductor in said meter housing.

BEST MODE FOR CARRYING OUT THE INVENTION

Figure 1:
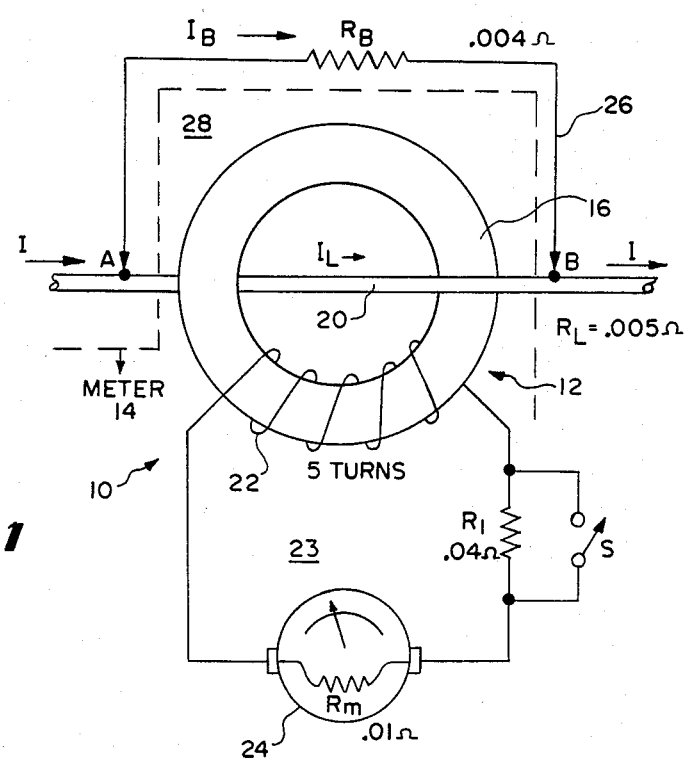
FIG. 1 is a schematic circuit diagram of an embodiment of the power theft detector circuit of the present invention.
Figure 3:
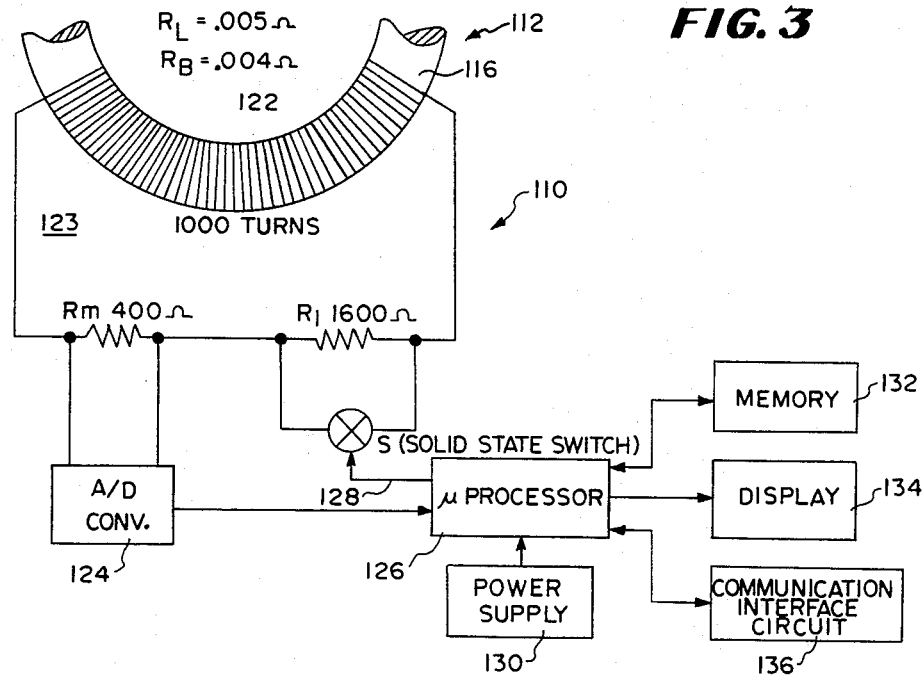
FIG. 3 is a schematic block circuit diagram of one practical realization of the power theft sensing circuit of the present invention for use with a current transformer input of the type shown in FIG. 1 and with a microprocessor.

Referring now to the drawings in greater detail, there is illustrated in FIG. 1 a schematic circuit diagram of one example or embodiment of a power theft detection circuit constructed in accordance with the teachings of the present invention. This embodiment of the power theft detection circuit is a theoretical example of the circuit. A more practical embodiment of the theft detection circuit of the present invention is illustrated in FIG. 3 and will be described hereinafter in connection with the description of FIG. 3.

The power theft detection circuit is generally identified by reference numeral 10 in FIG. 1 and includes a current transformer 12 located within a meter 14 indicated by phantom lines. The current transformer 12 includes a toroidal core 16 with a line conductor 20 passing therethrough and forming a primary winding 20 of the transformer 12 and with a five-turn secondary winding 22 forming part of a transformer secondary circuit 23. The secondary circuit 23 also includes a current/voltage sensing meter 24 having a resistor $R_m$ with a resistance of 0.01 ohm series connected with another resistor $R_I$ having a resistance of 0.04 ohm, both connected in series across the secondary winding 22. The theft detection circuit 10 further includes a single pole, single throw switch S which can be opened or closed at will to insert or take out of the secondary circuit 23 the resistance of resistor $R_I$.

In the theoretical example shown in FIG. 1, the resistance $R_L$ of the line conductor 20 passing through the transformer core 16 is assumed to be 0.005 ohm and a low resistance jumper 26 connected across points A and B of line conductor 20 is assumed to have a resistance of 0.004 ohm.

Figure 2:
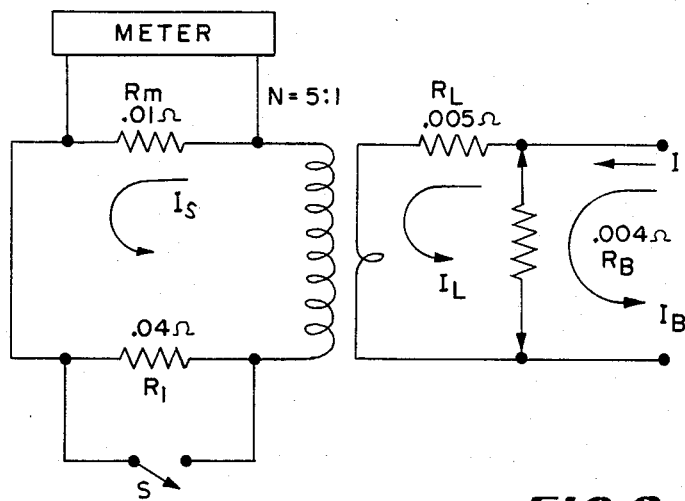
FIG. 2 is an equivalent circuit diagram of the power theft detector circuit shown in FIG. 1.

In FIG. 2 there is illustrated an equivalent circuit of the circuit 10 shown in FIG. 1. Here it will be seen that a current I will flow through the resistance $R_L$ in the primary winding formed by the line conductor 20. The impedance in the secondary circuit 23 of $R_m$ equals 0.01 ohm plus $R_L$ equals 0.04 ohm is a total of 0.05 ohm and this resistance is reflected back into primary circuit 28 by a factor equal to the inverse of the turns ratio N, i.e., $1/N^2$. Without the jumper 26, the current I will encounter a resistance equal to the reflected resistance $R_{rfl} = 0.05/25 = 0.002$ ohm, plus the resistance $R_L = 0.005$ ohm, a total of 0.007 ohm.

It will be assumed that the incoming current I is 20 amps so that with the turns ratio N=5, 4 amps are generated in the secondary circuit 23.

With switch S open, the amount of resistance in the secondary circuit 23 is $R_m + R_I$ or 0.01 ohm + 0.04 ohm = 0.05 ohm. As stated above, this 0.05 ohm is reflected back into the primary winding 20 as 0.002 ohm. Thus the current I=20 amps will encounter $R_{rfl} + R_L = 0.002$ ohm + 0.005 ohm = 0.007 ohm. Four amps will flow in the secondary winding as a result of which the meter 24 which is calibrated for primary line current will indicate 20 amps.

Now, when switch S is closed, there is only 0.01 ohm in the secondary circuit 23 and this is reflected back into the primary winding formed by line conductor 20 as 0.01/25 = 0.0004 ohm so that the 20 amp current I will experience 0.0004 $(R_{rfl})$ + 0.005 $(R_L)$ = 0.0054 ohm. However, since 20 amps will continue to flow through the line conductor 20 regardless of the impedance reflected back into the line conductor or primary winding 20 by the secondary circuit 23 and since the current transformer operates to drive the secondary winding to whatever voltage is necessary to generate I/N amps in the secondary winding, 20/5=4 amps, the meter 24 will still register 4 amps. Therefore, whether there is 0.05 ohm in the secondary circuit 23, that is to say with $R_I$ in the circuit 23, or whether there is only 0.01 ohm in the circuit, that is to say with $R_I$ shorted out by switch S, 4 amps will always flow through the power theft detection circuit 10 resulting in the same reading by the ammeter 24 regardless of the position of switch S when there is no short circuit jumper across points A and B.

Now, when a jumper 26 having a resistance $R_B = 0.004$ ohm is connected across points A and B around the meter 14, there is a parallel path for the flow of the current I—20 amps from point A to point B and some of the current I will flow through the meter 14 as $I_L$ and some of the current I will flow through the jumper 26 as $I_B$. The amount of current $I_L$ that flows through $R_L$ equals $I \times R_B/(R_L + R_B)$ and the current $I_B = I \times R_L/(R_L + R_B)$. Now, since the value of $R_L$ can be changed by the amount of impedance reflected back into the primary winding/line conductor 20 which includes the resistance $R_L$, the division of the current I can be altered by the operation of switch S. This altering of the division of current by operation of the switch S to alter the amount of impedance reflected from the secondary winding 22 back into the primary winding/line conductor 20 will result in two different currents $I_L$ for the two different positions of switch S so that the ammeter 24 will read two different currents depending upon whether switch S is open or closed. This phenomenon is utilized by the power theft detection circuit 10 of the present invention to sense a theft of power by reason of a jumper 26 across points A and B.

With the specific resistances shown in FIGS. 1 and 2 for a current of 20 amps, the phenomenon that occurs with the jumper 26, I=20 amps, $R_B = 0.004$ ohm and $R_L = 0.005$ ohm upon the opening and closing of the switch S is as follows:

With the switch S open, and with 0.05 ohm in the secondary circuit, there is 0.05/25 or 0.002 ohm reflected back into the primary winding 20 and added to $R_L$ yielding 0.005 + 0.002 = 0.007 ohm sensed across A and B in line conductor 20 and 0.004 ohm in the jumper 26. The current I will then split, such that 7.27 amps flows through the line conductor 20 and 12.73 amps flows through the jumper 26.

As a result, the ammeter 24 will read 7.27 amps.

Now, when switch S is closed, only 0.01 ohm is reflected back into the primary winding/line conductor 20. This equals 0.01/25 or 0.004 ohm that is added to $R_L$ yielding 0.0004 ohm + 0.005 ohm equals 0.0054 ohm. As a result, 54/94 × I current will flow through jumper 26 and 40/94 × I current will flow through line conductor 20. This results in $I_L$ now being equal to 8.51 amps and $I_B$ being equal to 11.49 amps. The ammeter 24 will now read 8.51 amps, a difference of 1.24 from the first measurement of $I_L$. Note that in either condition, S open or S closed, the current through the secondary circuit 23 will be 1/5 $I_L$.

The difference in ampere measurements made by the power theft detection circuit 10 of the present invention can be utilized to raise an alarm or flag indicating that a power theft condition exists.

Referring now to FIG. 3, there is illustrated therein a more practical embodiment of the power theft detection circuit of the present invention which is generally identified by reference numeral 110. The power theft detection circuit 110 includes a current transformer 112, only part of which is shown in FIG. 3 and which has a toroidal core 116 and a secondary winding 122 forming part of a secondary circuit 123. It is to be understood that a line conductor such as line conductor 20 having a resistance $R_L$ of 0.005 ohm is coupled to, i.e., passes through, the core 116 and that the power theft condition is esbalished by a jumper (not shown) having a resistance $R_B$ of 0.004 ohm as shown in FIG. 1.

Here the secondary winding 122 has 1000 turns, a turn ratio N=1000 and the secondary circuit 123 includes a meter resistor $R_m$ equal to 400 ohms and a resistor $R_l$ equal to 1600 ohms. An analog to digital (A/D) converter 124 is coupled across the resistance $R_m$ and senses the voltage thereacross which is converted to a current value in digital form and supplied to a microprocessor 126. A solid state electronic switch S is connected across the resistance $R_L$ and the gate or trigger thereof is coupled to an output line 128 from the microprocessor 126.

The microprocessor 126 is powered by a conventional power supply 130. Also coupled to the microprocessor 126 is a memory 132, a visual display 134 and a communication interface circuit 136.

It is contemplated that the microprocessor 126 forms part of a solid state or electronic watthour meter as disclosed in copending application Ser. No. 303,599 filed on Sept. 18, 1981 for: SOLID STATE WATTHOUR METER (now U.S. Pat. No. 4,466,074) or in copending application Ser. No. 353,476 filed on Mar. 1, 1982 and entitled: ELECTRO-OPTICAL SENSOR FOR WATTHOUR METER (now U.S. Pat. No. 4,489,384) the disclosures of which are incorporated herein by reference.

The display 134 can be incorporated into a watthour meter for displaying the different currents sensed by the A/D converter 124 as a result of the different measurements of voltage across $R_m$ (related to current) or can display a coded alarm indicating a power theft condition such that a meter reader, knowing the code, can quickly determine that a power theft condition exists, while such coded alarm is unintelligible to the consumer engaged in the power theft.

The memory 132 enables the microprocessor 126 to find a consistent different current reading upon a number of cycles of the switching of the switch S on and off. In this respect, each reading of the A/D converter 124 is stored in the memory 132. The stored values are maintained by the microprocessor 126 until it definitely knows that a power theft condition exists and that a difference in current readings was not caused by a change in the consumer's load occasioned by the switching on or off of a load.

Also, the memory 132 can be utilized to store the difference in current values and the time those differences in current value exist so that a computation can be made by the microprocessor 126 or later by the electric utility company of the amount of power stolen so that the consumer can be billed accordingly.

In addition, or as an alternative, the communication interface circuit 136 is provided for coupling the microprocessor 126, either over the electric utility's power line or via a telephone line, to a data processing center of the electric utility company so that an alarm or flag can be immediately generated at the data processing center indicating a power theft condition at a particular location so that employees of the electric utility company can immediately investigate the power theft condition and, if necessary, terminate service to the consumer committing the power theft.

The values of the resistors $R_m$ and $R_L$ are shown as being 400 ohm and 1600 ohms respectively. With these values of resistance and with 1000 turns in the secondary winding 123, lower currents will be generated in the secondary winding circuit by 20 amps flowing in the line conductor. However, when the electronic switch S is open, the A/D converter 124, calibrated to read the line current flowing through the line conductor, will sense 7.27 amps, and when the electronic switch S is closed, the A/D converter 124 will sense 8.51 amps with a jumper across points A,B.

Figure 4:
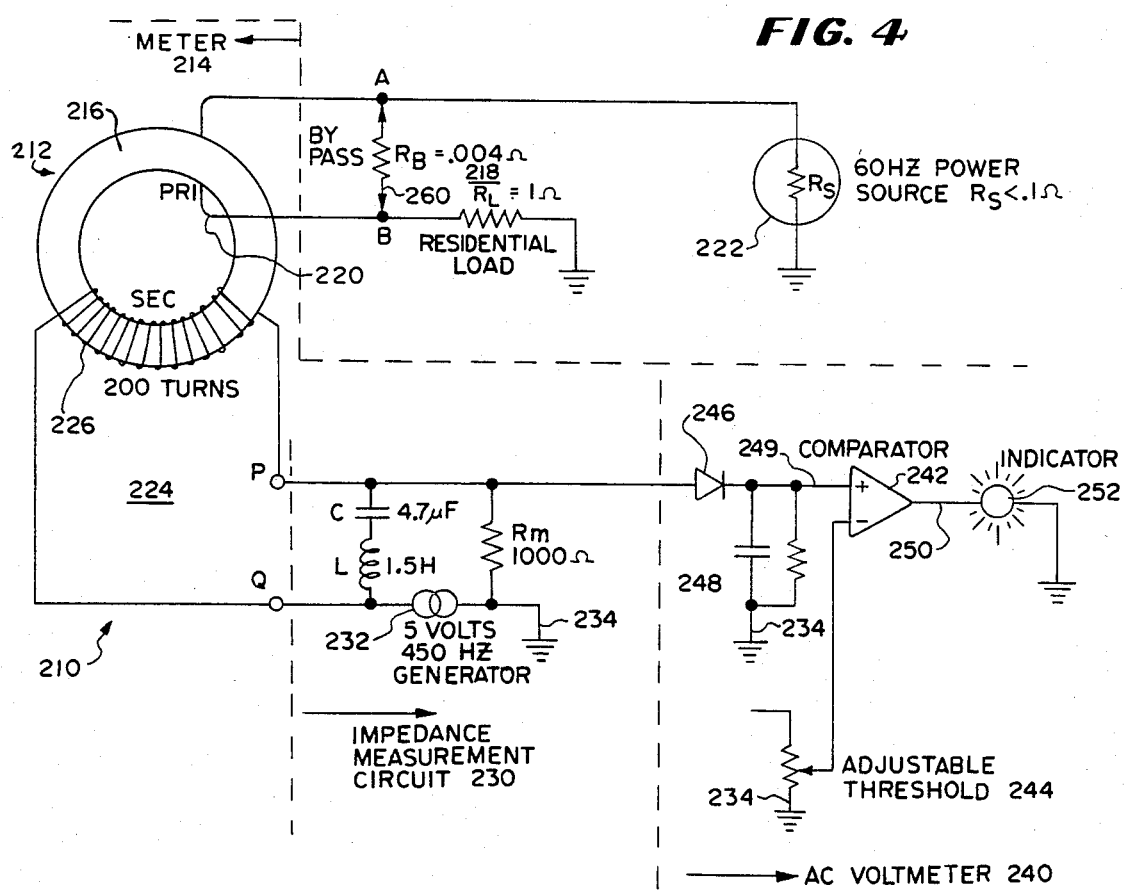
FIG. 4 is a schematic circuit diagram of still a further embodiment of the power theft detection circuit of the present invention which measures reflected impedance.

Referring now to FIG. 4, there is illustrated therein another embodiment of the power theft detection circuit of the present invention which is generally identified therein by reference numeral 210. The power theft detection circuit 210 includes a current transformer 212 which is mounted within a watthour meter 214 and which has a toroidal core 216.

The current transformer 212 includes a primary circuit which includes a line conductor 220, the consumer's load $R_L$ which is shown as being equal to 1 ohm, the public utility generating station which is generally identified by reference numeral 222 and is assumed to be a 60 Hz source having an internal resistance $R_S$ which is less than 0.1 ohm.

The current transformer 212 further includes a secondary circuit 224 comprising a secondary winding 226 having 200 turns and having output terminals P and Q.

In this embodiment (and in accordance with the teachings of the present invention) the power theft detection circuit 210 includes an impedance measuring circuit 230 which is connected across the terminals P and Q of the secondary winding 226. As shown, the impedance measuring circuit 230 includes a 4.7 microfarad capacitor C and a 1.5 Henry inductor L which are connected in series across the terminals P and Q and which are series resonant with a 60 Hz signal from the primary circuit 218 so as to form a short circuit to the 60 Hz signal from the primary circuit 218.

The impedance measuring circuit 230 further includes a 5 volt, 450 Hz generator 232 connected between the terminal Q and system ground 234 and a sensing resistor $R_m$ of 1000 ohms connected between terminal P and system ground 234.

Coupled to the impedance measuring circuit 230, or more specifically, across the sensing resistor $R_m$ is an AC voltmeter 240. The AC voltmeter 240 includes a comparator 242 having one input coupled to an adjustable threshold voltage circuit 244 and another input coupled through a diode 246 to the sensing resistor $R_m$. An RC filter circuit 248 is coupled between the input of the comparator 242 and system ground 234 to provide a DC voltage to input 249 of the comparator 242.

An output 250 of the comparator 242 is coupled to an indicator 252 for actuating same to indicate that a certain threshold voltage has been exceeded which, as will be described hereinafter, indicates a power theft condition.

In a normal operating situation where there is no low resistance jumper, such as jumper 260, across the points A and B in the line conductor 220, the 1.1 ohm resistance ($R_L+R_S$) of the primary circuit 218 is reflected by the square of the turns ratio ($200^2$) into the secondary circuit 224. As a result, approximately 40,000 ohms are seen across the terminals P and Q during normal operating conditions. The CL circuit acts as a short circuit to the 60 Hz signal from the primary circuit generated in the secondary circuit so that the 60 Hz signal does not appear across $R_m$. Meanwhile, the CL circuit acts as 4200 ohms of reactive impedance to the 450 Hz generator 232.

As a result, under normal operation (without jumper 260), the voltage across the sensing resistor $R_m$ is about 1 volt due to the parallel connection of 40,000 ohms resistance and 4200 ohms reactance in series with $R_m$. However, when the jumper 260 is connected across the meter, namely across points A and B of conductor 220, the resistance of the jumper is 0.004 ohms and this impedance is reflected from the primary circuit 218 into the secondary circuit 224 instead of 1.1 ohms. As a result, $0.004 \times 4 \times 10^4$ ohms, i.e., 160 ohms is reflected back into the secondary circuit 124. This is a much smaller resistance than the 40,000 ohms such that the 160 ohms connected in parallel with the 4200 ohm reactance and in series with the 1000 ohms of sensing resistor $R_m$ across the 450 Hz 5 volt generator 232 results in a voltage drop of about 4 volts across the sensing resistor $R_m$.

The adjustable threshold voltage from the threshold circuit 224 is set above 1 volt and less than 4 volts, such that under normal operating conditions the output of the comparator 242 is at logic 0. However, when there is a jumper 250 across terminals A and B in the primary circuit 218, the voltage at input 259 is above 4 volts causing output 250 to go to logic 1 indicating a power theft condition exists. The indicator 252 can be a simple light emitting diode or can be a more sophisticated type of indicator. Also, the output of the comparator 250 can be sent to a port of the microprocessor which will then send a signal to a display, like the display 124, or to a communication interface circuit, like the circuit 136, shown in FIG. 3.

From the foregoing description it will be apparent that the method and apparatus 10, 110 and 210 of the present invention involve sensing the effect of a reflected impedance from a secondary circuit into a primary circuit having parallel branches as shown in FIGS. 1, 2 or 3 or by sensing a difference in reflected resistance from a primary circuit into a secondary circuit as caused by a jumper across a meter as shown in FIG. 4.

Also it will be apparent that the method and the apparatus 10, 110 or 210 for practicing the method of the present invention provide a number of advantages, some of which are described above and others of which are inherent in the invention.

Furthermore, it will be apparent to those skilled in the art that modifications can be made to the method and apparatus of the present invention without departing from the teachings of the invention. Accordingly, the scope of the invention is only to be limited as necessitated by the accompanying claims.

I claim:

1. A method for detecting the theft of electric power by the insertion of a low resistance jumper connected in parallel with a section of line conductor through which electrical current flow is measured by a meter, comprising the steps of:
   coupling the section of line conductor within the meter to a current transformer such that the section of line conductor forms a primary winding of said current transformer, said current transformer including a multi-turn secondary winding;
   coupling said secondary winding into a secondary electrical circuit; and
   electrically sensing a change in the impedance reflected into said secondary circuit from a primary circuit formed when the low resistance jumper is connected in parallel with the impedance of the section of line conductor forming said primary winding by:
   (a) altering the impedance in said secondary electrical circuit by inserting and removing a pre-selected value of impedance in said secondary electrical circuit;
   (b) measuring the current in said secondary electrical circuit before and after altering the impedance, and
   (c) comparing the measured current before and after altering the impedance.

2. Power theft detection apparatus for detecting when power is being diverted around a line conductor passing through a watt-hour meter housing, comprising:
   a current transformer coupled to at least one line conductor within said meter housing, said line conductor in said meter housing defining a primary winding of said transformer and forming at least part of a primary circuit, said transformer including a secondary winding;
   a secondary electrical circuit including said secondary winding, a first resistor in series with a second resistor and shorting means for electrically short circuiting said first resistor; and
   sensing means, in said secondary circuit for sensing a change in the impedance reflected from the primary circuit into the secondary circuit when a low impedance jumper is connected in parallel with the line conductor in said meter housing, said sensing means comprising voltage magnitude measuring means, calibrated to line current and coupled across said second resistor, for measuring the voltage across said second resistor,
   said change in impedance being sensed by sensing a difference in current flowing through said second resistor, the impedance of the line conductor presented to the load current flowing into the parallel connection of said line conductor and the low impedance jumper being reflected into said secondary circuit and the flow of current flowing through said second resistor being altered by opening and closing of said shorting means.

3. The power theft detection apparatus of claim 2:
   wherein said voltage magnitude mesuring means includes an A/D converter, and a microprocessor having an input coupled to said A/D converter,
   wherein said short circuiting means comprise a solid state short circuiting switch which is operated by said microprocessor, and
   wherein said microprocessor is constructed, arranged and programmed to cyclically close said solid state short circuiting switch, to compute any changes in the output of said A/D converter and, upon sensing steady state changes in measured voltage (current) upon cyclical operation of said solid state short circuiting switch, to generate an alarm signal indicating a power theft condition.

* * * * *